(12) United States Patent
Kim

(10) Patent No.: US 6,936,838 B2
(45) Date of Patent: Aug. 30, 2005

(54) NITRIDE-BASED SEMICONDUCTOR DEVICE

(75) Inventor: Sun Woon Kim, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 16 days.

(21) Appl. No.: 10/776,270

(22) Filed: Feb. 12, 2004

(65) Prior Publication Data

US 2005/0067613 A1 Mar. 31, 2005

(30) Foreign Application Priority Data

Sep. 26, 2003 (KR) .................................. 10-2003-0066992

(51) Int. Cl.⁷ ..................... H01L 29/06; H01L 31/0328; H01L 31/0336
(52) U.S. Cl. ............................. 257/14; 257/17; 257/96; 257/101; 257/103
(58) Field of Search ............................. 257/14, 17, 96, 257/101, 103

(56) References Cited

U.S. PATENT DOCUMENTS

2002/0155712 A1 * 10/2002 Urashima et al. ........... 438/689
2004/0161006 A1 *  8/2004 Chang et al. ................ 372/45

FOREIGN PATENT DOCUMENTS

WO    WO 00/76004 A1    12/2000

OTHER PUBLICATIONS

"Spiral Growth of IngaN Nanoscale Islands on GaN" by Keller et al.; Japanese Journal of Applied Physics, vol. 37, pp. L431–L434, c. 1998.

* cited by examiner

Primary Examiner—David Nelms
Assistant Examiner—Tu-Tu Ho
(74) Attorney, Agent, or Firm—Lowe Hauptman & Berner, LLP (57) ABSTRACT

Disclosed is a nitride-based semiconductor device including a first nitride semiconductor layer doped with an n type impurity, an active layer formed on the first nitride semiconductor layer, the active layer including a plurality of quantum well layers and a plurality of quantum barrier layers alternately laminated over one another, at least one of the quantum layers being doped with the n type impurity, and a nitride semiconductor layer formed over the active layer, and doped with a p type impurity. The quantum barrier layer doped with the n type impurity includes an internal layer portion doped with the n type impurity, and an anti-diffusion film arranged at an interface of the quantum barrier layer with an adjacent one of the quantum well layers, the anti-diffusion film having an n type impurity concentration lower than that of the internal layer portion.

14 Claims, 6 Drawing Sheets

FIG. 1a
PRIOR ART

PRIOR ART

NITRIDE-BASED SEMICONDUCTOR DEVICE

BACKGROUND OF THE INVENTION

1. Field of the Invention

The present invention relates to a nitride-based semiconductor device, and more particularly to a nitride-based semiconductor device for use in light emitting diodes, laser diodes, and the like, which has an improved active layer structure to achieve a reduction in operating voltage, so that it has an improved output efficiency.

2. Description of the Related Art

Generally, nitride semiconductors are widely used in green or blue light emitting diodes (LEDs) adapted as a light source for full-color displays, image scanners, various signal systems, and optical communication appliances. In such an LED, its active layer generates light in accordance with the principle of electron-hole recombination, and emits the generated light.

The active layer of such an LED may have a single quantum well (SQW) structure or a multiple quantum well (MQW) structure having a plurality of quantum well layers each having a thickness of less than about 100 Å. In particular, the MQW structure has been preferably used because an active layer having the MQW structure exhibits a superior optical efficiency-to-current ratio and a high emission power, over an active layer having the SQW structure.

Figure 1A:
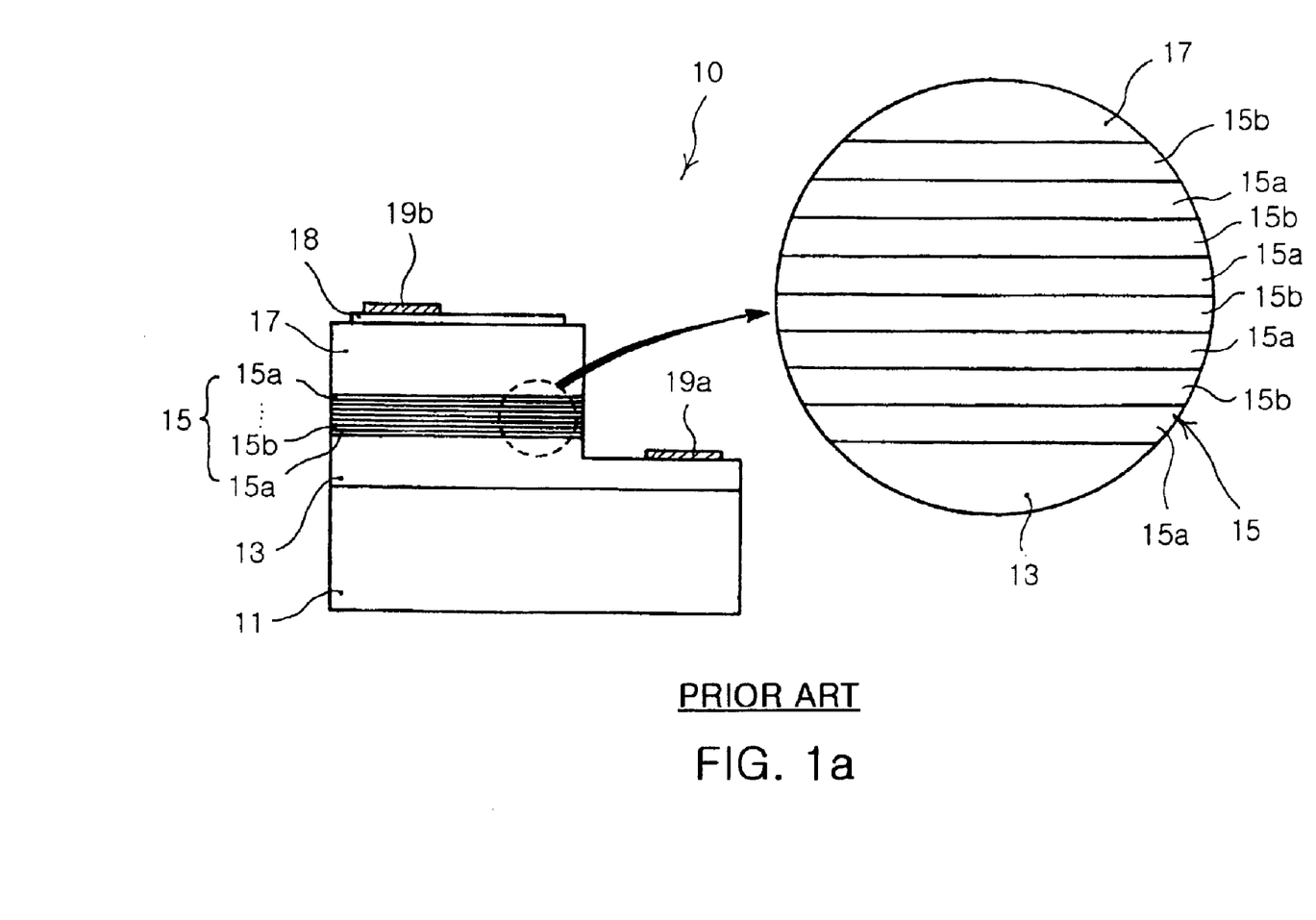
FIG. 1a is a sectional view illustrating a conventional semiconductor LED.

FIG. 1a is a sectional view illustrating a conventional GaN-based semiconductor LED structure.

As shown in FIG. 1a, the GaN-based semiconductor LED denoted by the reference numeral 10 includes a sapphire substrate 11, a first nitride semiconductor layer 13 made of an n type GaN, an active layer 15 having an MQW structure, and a second nitride semiconductor layer 17 made of a p type AlGaN or p type GaN. An n type electrode 19a is formed on a mesa-etched upper surface of the second nitride semiconductor layer 17. Also, a transparent electrode layer 18 and a p type electrode 19b are sequentially formed on the first nitride semiconductor layer 13.

Figure 1B:
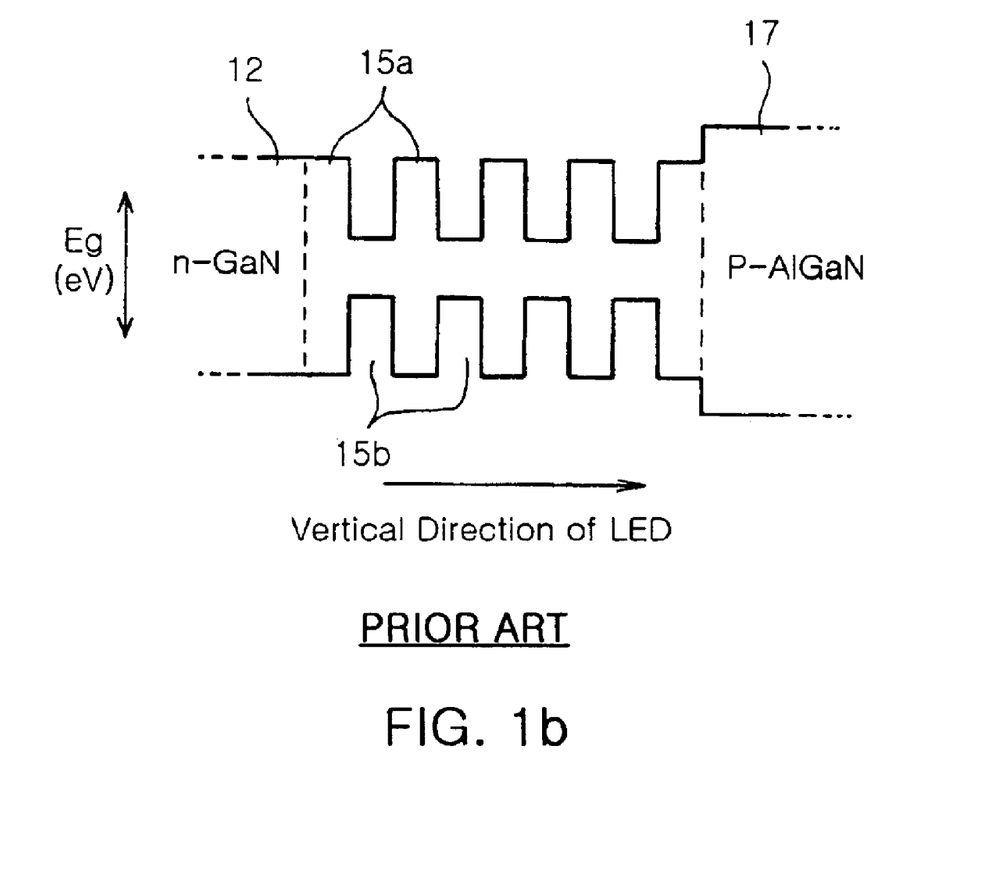

The active layer 15 having an MQW structure includes undoped GaN barrier layers 15a and undoped InGaN quantum well layers 15b alternately laminated over one another. FIG. 1b shows an energy band gap distribution of the MQW structure of the active layer 15. In FIG. 1b, the energy band gap is designated by "Eg". Referring to FIG. 1b, it can be seen that the active layer 15 has a plurality of InGaN quantum well layers each interposed between GaN barrier layers having a large band gap. The active layer having such an MQW structure emits light by use of its quantum well layers arranged in series. Accordingly, the LED 10 can exhibit a superior optical efficiency-to-current ratio and a high emission power, over an those having the SQW structure.

However, the active layer 15 having an MQW structure inevitably has a relatively large thickness, as compared to active layers having an SQW structure because it has a multi-layer structure. For this reason, in the case having the above mentioned MQW structure, there may be problems of an increase in longitudinal serial resistance caused by an increased layer thickness, and thus, an increase in forward voltage ($V_f$).

Figure 2A:
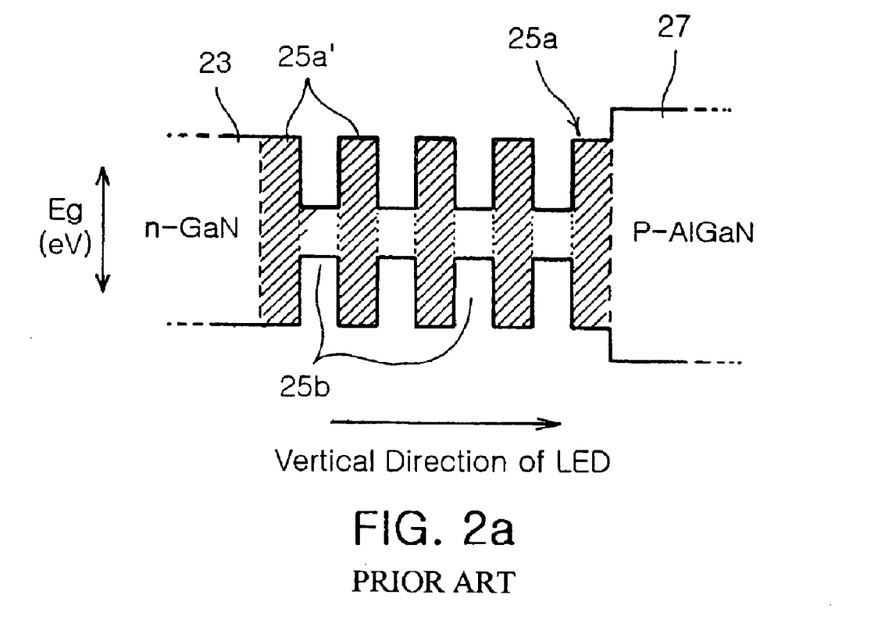
FIGS. 2a and 2b are energy band diagrams of active layer structures altered to achieve an improvement in forward voltage in conventional semiconductor LEDs, respectively.
Figure 2B:
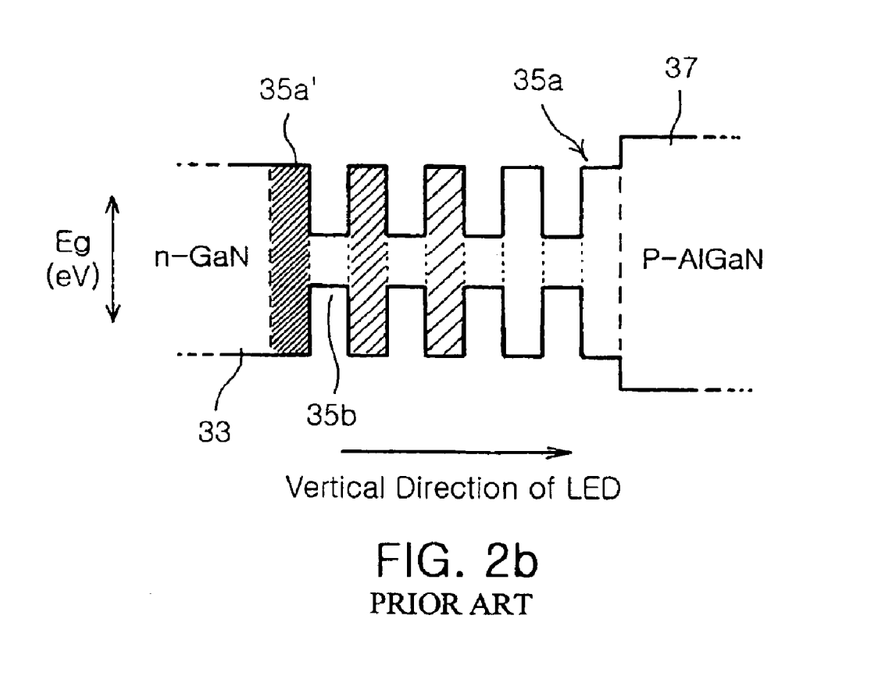

In order to solve the above mentioned problems, a scheme has been proposed in which an n type impurity such as Si is doped into the quantum barrier layers. FIGS. 2a and 2b are energy band diagrams respectively illustrating active layer structures altered to achieve an improvement in forward voltage.

The structure of FIG. 2a may be a part of the semiconductor LED structure shown in FIG. 1. FIG. 2a shows an active layer 25 arranged between an n type GaN semiconductor layer 23 and a p type AlGaN semiconductor layer 27 while including four quantum well layers 25b and five quantum barrier layers 25a' having a band gap larger than that of the quantum well layers 25b. This scheme utilizes the principle of doping an n type impurity in the quantum barrier layers 25a' to reduce a resistance generated in the quantum barrier layers 25a when a voltage is applied across the semiconductor LED, thereby enhancing the probability of electron-hole recombination. Through this scheme, therefore, it is possible to produce a reduction in the forward voltage $V_f$.

Another structure similar to the above mentioned structure is illustrated in FIG. 2b. The scheme illustrated in FIG. 2b is adapted to improve the structure of FIG. 2a. This scheme is disclosed in the Korean Patent Laid-open Publication No. 2002-21121.

As shown in FIG. 2b, the LED structure according to this scheme includes an active layer 35 arranged between an n type GaN semiconductor layer 33 and a p type AlGaN semiconductor layer 37 while including four quantum well layers 35b and five quantum barrier layers 35a and 35a' having a band gap larger than that of the quantum well layers 35b, similar to the structure of FIG. 2a. In this case, an n type impurity is doped in only a part of the five quantum barrier layers, that is, three quantum barrier layers 35a'. The three quantum barrier layers 35a' doped with the n type impurity are arranged adjacent to the n type GaN semiconductor layer 33 while having a higher impurity concentration at a more adjacent one thereof to the n type GaN semiconductor layer 33. The reason why such a selective doping method is used is that the probability of electron-hole recombination at the side of the n type semiconductor layer 33 is lower than that at the side of the p type AlGaN semiconductor layer 37 because the mobility of holes is lower than that of electrons.

Thus, the scheme of selectively doping an n type impurity in the quantum barrier layers 35a' exhibiting a low probability of electron-hole recombination may be used in order to obtain a superior optical efficiency-to-current ratio and a high emission power, in place of the scheme of achieving a reduction in the forward voltage $V_f$ in accordance with doping of an n type impurity.

However, the above mentioned conventional schemes may cause a degradation in light emission efficiency because the n type impurity doped in the quantum barrier layers may be diffused into the quantum well layers. In the Japanese Journal of Applied Physics Vol. 37, 1998, pp. L431–L434, it is also reported that the growth mode of a quantum well layer of InGaN to be grown over a quantum barrier layer of GaN may vary in accordance with a variation in the amount of Si doped in the quantum barrier layer, so that the surface morphology of the quantum well layer may vary, thereby causing a degradation in optical characteristics. Thus, the scheme of doping an n type impurity in quantum barrier layers may practically adversely affect the light emission efficiency and optical characteristics of the resultant LED structure.

Therefore, a new scheme has been demanded in the technical field to which the present invention pertains, in order to reduce the resistance of quantum barrier layers in a nitride-based semiconductor device such as an LED, thereby achieving an improvement in forward voltage characteristics without causing a degradation in the optical characteristics of the active layer and a variation in process conditions.

SUMMARY OF THE INVENTION

The present invention has been made in view of the above mentioned technical problems, and an object of the invention is to provide a nitride-based semiconductor device in which an anti-diffusion film is formed at the interface of a quantum barrier layer with a quantum well layer in order to prevent an n type impurity from being diffused into the quantum well layer, so that it is possible to achieve an improvement in optical power and optical efficiency without degrading the optical characteristics of the quantum well layer.

In accordance with the present invention, this object is accomplished by providing a nitride-based semiconductor device comprising: a first nitride semiconductor layer doped with an n type impurity; an active layer formed on the first nitride semiconductor layer, the active layer including a plurality of quantum well layers and a plurality of quantum barrier layers alternately laminated over one another, at least one of the quantum layers being doped with the n type impurity; and a nitride semiconductor layer formed over the active layer, and doped with a p type impurity, wherein the at least one quantum barrier layer doped with the n type impurity includes an internal layer portion doped with the n type impurity, and an anti-diffusion film arranged at an interface of the quantum barrier layer with an adjacent one of the quantum well layers, the anti-diffusion film having an n type impurity concentration lower than that of the internal layer portion.

Preferably, the anti-diffusion film has an impurity concentration corresponding to 50% or less of the impurity concentration of the internal layer portion in the associated quantum barrier layer.

In an embodiment of the present invention, each of the quantum barrier layers is made of $Al_{x1}In_{y1}Ga_{1-x1-y1}N$ ($x_1+y_1=1$, $0 \leq x_1 \leq 1$, $0 \leq y_1 \leq 1$), and each of the quantum well layers is made of $Al_{x2}In_{y2}Ga_{1-x2-y2}N$ ($x_2+y_2=1$, $0 \leq x_2 \leq 1$, $0 \leq y_2 \leq 1$) having an energy band gap smaller than that of the quantum barrier layers. The internal layer portion of the at least one quantum barrier layer doped with the n type impurity has an n type impurity concentration not more than that of the first nitride semiconductor layer. Preferably, the n type impurity concentration of the internal layer portion is about $3 \times 10^{16}/cm^3$ to about $3 \times 10^{19}/cm^3$.

Also, the n type impurity may be at least one material selected from a group consisting of Si, Ge, and Sn.

The anti-diffusion film in the at least one quantum barrier layer is not doped intentionally with n type impurity (for example, the inevitable impurity concentration may be about $10^{13}$ to $10^{19}/cm^3$ or less).

The at least one quantum barrier layer doped with the n type impurity may comprise one or both of the quantum barrier layers respectively contacting the first and second nitride semiconductor layers while having anti-diffusion films arranged at respective interfaces of the quantum barrier layers with the first and second nitride semiconductor layers. Alternatively, the at least one quantum barrier layer doped with the n type impurity may comprise at least one of the quantum barrier layers each interposed between adjacent ones of the quantum well layers while having anti-diffusion films arranged at respective interfaces of the quantum barrier layer with the adjacent quantum well layers.

Preferably, the at least one quantum barrier layer doped with the n type impurity comprises those of the quantum barrier layers arranged at the side of the first nitride semiconductor layer.

The at least one quantum barrier layer doped with the n type impurity may comprise two or more of the quantum barrier layers included in the active layer. At least one of the two or more quantum barrier layers may have an n type impurity concentration different from those of the other quantum barrier layers.

In this case, the quantum barrier layer contacting the first nitride semiconductor layer may have a highest n type impurity concentration, and the remaining quantum barrier layers may exhibit a lower n type impurity concentration at a more adjacent one thereof to the second nitride semiconductor layer.

Preferably, the anti-diffusion film of the at least one quantum barrier layer doped with the n type impurity may have a thickness corresponding to about 10% to about 40% of the thickness of the quantum barrier layer. The thickness of the at least one quantum barrier layer doped with the n type impurity may be about 3 nm to about 30 nm, and the thickness of the anti-diffusion film may be about 0.3 nm to about 10 nm.

Each anti-diffusion film may have an n type impurity concentration and a thickness varying depending on the concentration and/or thickness of the associated quantum barrier layer.

BRIEF DESCRIPTION OF THE DRAWINGS

The above objects, and other features and advantages of the present invention will become more apparent after reading the following detailed description when taken in conjunction with the drawings, in which:

FIG. 1b is an energy band diagram of an active layer having an MQW structure in the conventional semiconductor LED shown in FIG. 1a;

DESCRIPTION OF THE PREFERRED EMBODIMENTS

Now, preferred embodiments of the present invention will be described in detail with reference to the annexed drawings.

Figure 3:
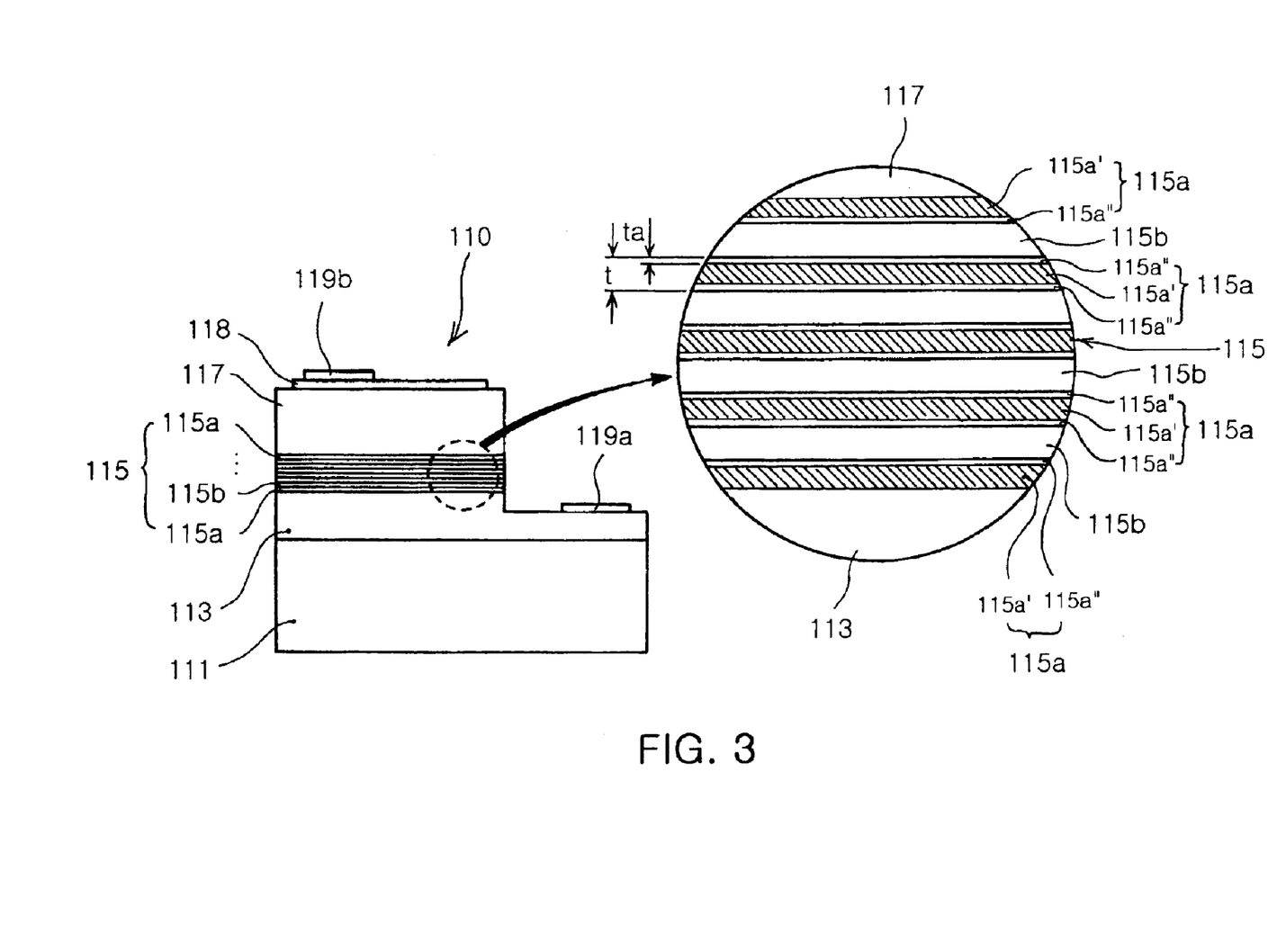
FIG. 3 is a sectional view illustrating a semiconductor LED according to an embodiment of the present invention.

FIG. 3 is a sectional view illustrating a GaN-based semiconductor LED according to an embodiment of the present invention.

As shown in FIG. 3, the GaN-based semiconductor LED designated by the reference numeral 110 includes a sapphire substrate 111, a first nitride semiconductor layer 113 made of an n type GaN, an active layer 115 having an MQW structure, and a second nitride semiconductor layer 117 made of a p type AlGaN or p type GaN. An n type electrode 119a is formed on a mesa-etched upper surface of the second nitride semiconductor layer 117. Also, a transparent electrode layer 118 and a p type electrode 119b are sequentially formed on the first nitride semiconductor layer 113.

The active layer 115 having an MQW structure is illustrated as including four undoped GaN barrier layers 115a and five undoped InGaN quantum well layers 115b alternately laminated over one another. However, there is no limitation on respective materials and numbers of the quantum barrier layers 115a and quantum well layers 115b. For example, the material of the quantum barrier layers 115b may be appropriately defined by "$Al_{x1}In_{y1}Ga_{1-x1-y1}N$ ($x_1+y_1=1$, $0 \leq x_1 \leq 1$, $0 \leq y_1 \leq 1$). The quantum well layers 115b are made of a material having an energy band gap smaller than that of the quantum barrier layers 115a. The material of the quantum well layers 115b may be appropriately defined by "$Al_{x2}In_{y2}Ga_{1-x2-y2}N$ ($x_2+y_2=1$, $0 \leq x_2 \leq 1$, $0 \leq y_2 \leq 1$).

In the illustrated embodiment, each quantum barrier layer 115a includes an internal layer portion 115a' doped with an n type impurity in order to achieve a reduction in serial resistance. The internal layer portion 115a' of the quantum barrier layer 115a has a n type impurity concentration not more than that of the first nitride semiconductor. Preferably, the internal layer portion 115a' of the quantum barrier layer 115a has an n type impurity concentration of about $3 \times 10^{16}$/cm$^3$ to about $3 \times 10^{19}$/cm$^3$.

In the illustrated embodiment, each quantum barrier layer 115a also includes an anti-diffusion film 115a" arranged at an interface of the quantum barrier layer 115a with an adjacent one of the quantum well layers 115b. Each of the quantum barrier layers 115a respectively contacting the first and second nitride semiconductor layers 113 and 117 may include only one anti-diffusion film 115a" arranged at an interface of the quantum barrier layer 115a with the quantum well layer 115b arranged adjacent thereto. On the other hand, each of the quantum barrier layers 115a interposed between adjacent quantum well layers 115b may include two anti-diffusion films 115a" arranged at respective interfaces of the quantum barrier layer 115a with the quantum well layers 115b arranged adjacent thereto.

In the illustrated embodiment, each anti-diffusion film 115a" has a structure, which is not doped intentionally with n type impurity. However, even when each anti-diffusion film 115a" has a doped structure, it is possible to remarkably reduce the amount of the impurity penetrated into the associated quantum well layer 115b, in so far as the anti-diffusion film 115a" has an impurity concentration lower than that of the other layer portion of the associated quantum barrier layer 115a, that is, the doped internal layer portion 115a', preferably, an n type impurity concentration corresponding to about 50% or less of the impurity concentration of the doped internal layer portion 115a'.

Moreover, where each anti-diffusion film 115a" has intentionally-not-doped structure or a doped structure having an impurity concentration corresponding to about 50% or less of the impurity concentration of the associated doped internal layer portion 115a', there may be an additional advantage in that it is possible to prevent variations in process condition and surface morphology from occurring when the quantum well layer 115b is grown over the quantum barrier layer 115a.

The anti-diffusion film 115a" has a thickness $t_a$ corresponding to 10 to 40% of the total thickness t of the quantum barrier layer 115a. Where the thickness $t_a$ of the anti-diffusion film 115a" is less than 10% of the total thickness of the quantum barrier layer 115a, the function of preventing an impurity diffusion into the quantum well layer 115b is weakened. On the other hand, where the thickness $t_a$ of the anti-diffusion film 115a" is more than 40% of the total thickness of the quantum barrier layer 115a, it is difficult to effectively perform the function of reducing the forward voltage because the internal layer portion 115a' of the doped quantum barrier layer 115a is too small. Where the quantum barrier layer 115a has a thickness t of about 3 mm to about 30 mm, it is preferred that its n type impurity anti-diffusion film 115a" have a thickness $t_a$ of about 0.3 mm to about 10 mm.

Figure 4A:
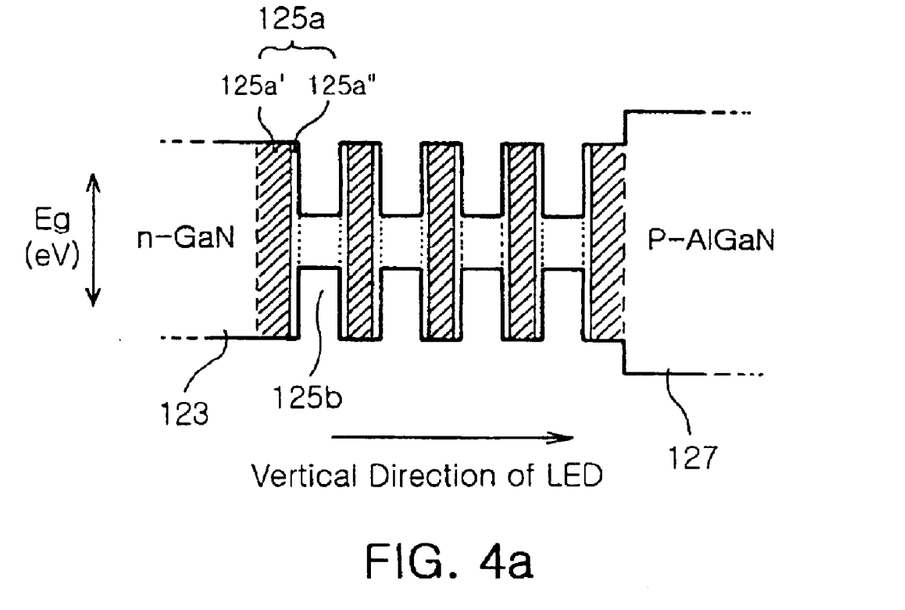
FIGS. 4a and 4b are energy band diagrams of an improved active layer according to embodiments of the present invention, respectively.
Figure 4B:
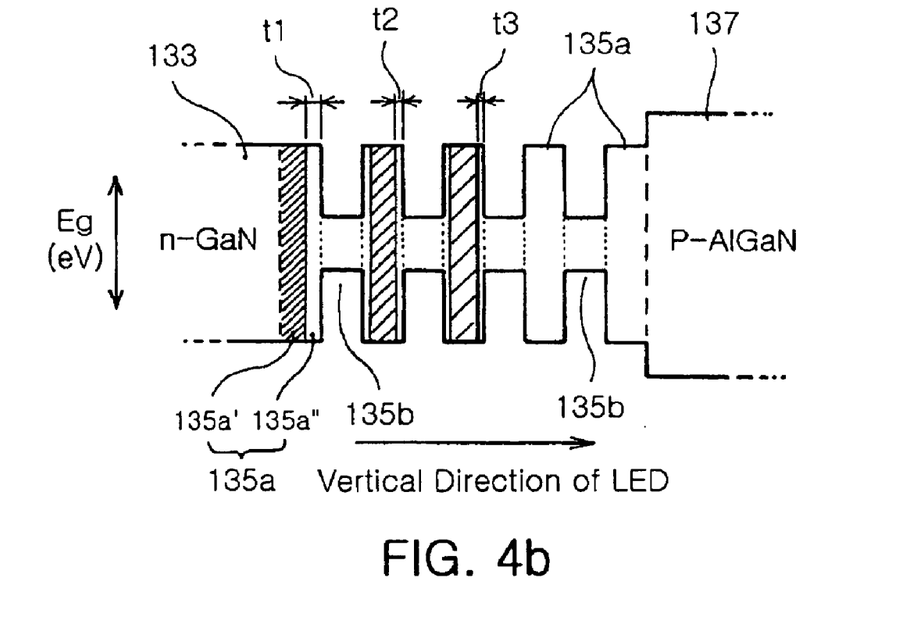

FIGS. 4a and 4b are energy band diagrams of an improved active layer according to embodiments of the present invention, respectively. In FIGS. 4a and 4b, the vertical axis represents the absolute value of energy band gap (eV), whereas the horizontal axis represents the vertical distance from an n type nitride semiconductor layer (n-GaN) to a p type nitride semiconductor layer (p-AlGaN).

The energy band gap diagram of FIG. 4a may be associated with a part of the LED structure shown in FIG. 3. Referring to FIG. 4a, an active layer 125 is shown which is arranged between an n type GaN semiconductor layer 123 and a p type AlGaN semiconductor layer 127 while including four quantum well layers 125b and five quantum barrier layers 125a having a band gap larger than that of the quantum well layers 125b.

In order to increase the probability of electron-hole recombination in the quantum well layers 125b, each quantum barrier layer 125a includes an internal layer portion 125a' doped with an n type impurity, and anti-diffusion films 125a" arranged at respective interfaces of the quantum barrier layer 125a with the quantum well layers arranged adjacent thereto. The anti-diffusion films 125a" have an n type impurity concentration lower than that of the other layer portion of the associated quantum barrier layer 125a, that is, the doped internal layer portion 125a'. Preferably, the anti-diffusion films 125a" have an n type impurity concentration corresponding to about 50% or less of the impurity concentration of the internal layer portion 125a'. More preferably, the anti-diffusion films 125a" is not doped intentionally.

In accordance with such a structure, it is possible to reduce the resistance generated at the quantum barrier layers 125a when a voltage is applied across the semiconductor LED implemented as shown in FIG. 4a, while reducing or preventing an impurity diffusion into the quantum well layers 125b by the lightly-doped or undoped anti-diffusion films 125a".

On the other hand, the present invention may also be applied to the case in which a plurality of quantum barrier layers doped with an n type impurity have different n type impurity concentrations, respectively, or the case in which the n type impurity is doped only in a part of the quantum barrier layers. Generally, an improvement in forward voltage may be achieved by selectively doping a desired impurity in quantum barrier layers arranged at the side of the n type nitride semiconductor layer exhibiting a low probability of electron-hole recombination. FIG. 4b shows the energy band gap of a semiconductor LED according to the embodiment of the present invention implementing such a concept.

Referring to the energy band gap diagram of FIG. 4b, an active layer 135 is shown which is arranged between an n type GaN semiconductor layer 133 and a p type AlGaN semiconductor layer 137 while including four quantum well layers 135b and five quantum barrier layers 135a having a band gap larger than that of the quantum well layers 135b. In this case, an n type impurity is doped in only a part of the five quantum barrier layers 135a, that is, three quantum barrier layers. That is, each of the three quantum barrier layers 135a has an internal layer portion 135a' doped with the n type impurity. The internal layer portions 135a' of the three doped quantum barrier layers 135a have a higher impurity concentration at a more adjacent one thereof to the n type GaN semiconductor layer 133. The reason why such a selective doping method is used is that the probability of electron-hole recombination at the side of the n type semiconductor layer 133 is lower than that at the side of the p type AlGaN semiconductor layer 137, as described above. Each of the three quantum barrier layers 135a doped with the n type impurity also includes anti-diffusion films 135a'' each adapted to prevent the impurity of the associated internal layer portion 135a' from being penetrated into an association one of the quantum well layers 135b arranged adjacent to the quantum barrier layer 135a. In the illustrated embodiment, the quantum barrier layers 135a doped with the n type impurity have internal layer portions 135a' having different impurity concentrations, respectively. Generally, the higher impurity concentration, the lager diffusion distance. Accordingly, the anti-diffusion films 135a'' may have different thicknesses in accordance with desired impurity concentrations thereof, respectively.

That is, the quantum barrier layer 135a contacting the n type nitride semiconductor layer 133 has an anti-diffusion film 135a'' having a largest thickness of $t_1$ because its impurity concentration is highest, whereas the quantum barrier layer 135a arranged at an intermediate portion of the active layer 135 has an anti-diffusion film 135a'' having a smallest thickness of $t_3$ because its impurity concentration is lowest ($t_1 > t_2 > t_3$).

Where each anti-diffusion film 135a'' is formed to have a low impurity concentration corresponding to, for example, 10% or less of the impurity concentration of the internal layer portion 135a' of the associated quantum barrier layer 135a, it may be possible to control the impurity concentration of the anti-diffusion film 135a'' in accordance with the impurity concentration of the internal layer portion 135a', similarly to the above described principle. That is, where the internal layer portion 135a' of the quantum barrier layer 135a has a high impurity concentration, the associated anti-diffusion film 135a'' may be formed to have a low impurity concentration corresponding to, for example, 3% or less of the impurity concentration of the internal layer portion 135a'. Also, where the internal layer portion 135a' of the quantum barrier layer 135a has a lower impurity concentration, the associated anti-diffusion film 135a'' may be formed to have a higher impurity concentration corresponding to, for example, 5 to 10% of the impurity concentration of the internal layer portion 135a'.

Thus, in the case in which the anti-diffusion films have different concentrations or thicknesses in order to effectively prevent an impurity diffusion, the thickness of each quantum barrier layer may be taken into consideration, in addition to the impurity concentration of each quantum barrier layer, specifically, its internal layer portion, in a similar manner to that associated with the impurity concentration of the quantum barrier layer.

The improved characteristics of the semiconductor LED according to the present invention will be described with reference to comparison of examples according to the present invention with comparative examples associated with conventional structures.

EXAMPLE 1

In this example, an LED was manufactured by sequentially depositing, over a sapphire substrate, an n type GaN semiconductor layer, an active layer having an MQW structure, and a p type GaN semiconductor layer, under the same deposition condition using an MOCVD process. The active layer having an MQW structure was formed to include five quantum well layers and six quantum barrier layers alternately laminated over one another. Each quantum well layer was made of an InGaN semiconductor layer having a thickness of 3 nm, whereas each quantum barrier layer was made of a GaN semiconductor layer having a thickness of 18 nm.

Also, each quantum barrier layer was formed to have anti-diffusion films having a thickness of 3 nm while being arranged at respective interfaces of the quantum barrier layer with the quantum well layers arranged adjacent thereto, similar to the structure of FIG. 3. The anti-diffusion films were not doped with any impurity intentionally. Each quantum barrier layer was doped with Si in an amount of 0.96 nmol at its internal layer portion, so as to have an impurity concentration of $1 \times 10^{17}/cm^3$.

EXAMPLE 2

In this example, an LED was manufactured under the same condition as that in Example 1, except that although each quantum barrier layer included in the active layer had the same anti-diffusion film as that of Example 1, it was doped with Si in an amount of 0.48 nmol at its internal layer portion, so as to have an impurity concentration of $5 \times 10^{16}/cm^3$.

COMPARATIVE EXAMPLE 1

In this comparative example, an LED was manufactured by sequentially depositing, over a sapphire substrate, an n type GaN semiconductor layer, an active layer having an MQW structure, and a p type GaN semiconductor layer, under the same deposition condition using an MOCVD process, in the same manner as that in Example 1. The active layer having an MQW structure was formed to include five quantum well layers and six quantum barrier layers alternately laminated over one another. Each quantum well layer was made of an InGaN semiconductor layer having a thickness of 3 nm, whereas each quantum barrier layer was made of a GaN semiconductor layer having a thickness of 18 nm.

However, each quantum barrier layer was formed to have no anti-diffusion film according to the present invention, as compared to Examples 1 and 2. Also, each quantum barrier layer was doped with Si in an amount of 0.96 nmol at its whole layer portion, so as to have an impurity concentration of $1 \times 10^{17}/cm^3$.

COMPARATIVE EXAMPLE 2

In this example, an LED was manufactured under the same condition as that in Example 1, except that although each quantum barrier layer included in the active layer had the same anti-diffusion film as that of Example 1, it was doped with Si in an amount of 0.48 nmol at its internal layer portion, so as to have an impurity concentration of $5 \times 10^{16}/cm^3$.

A performance test associated with operating voltage and luminance was performed for the semiconductor LEDs according to Examples 1 and 2 and the semiconductor LEDs according to Comparative Examples 1 and 2, in order to compare the characteristics of the semiconductor LEDs. The results of the performance test are depicted by a graph of FIG. 5.

Figure 5:
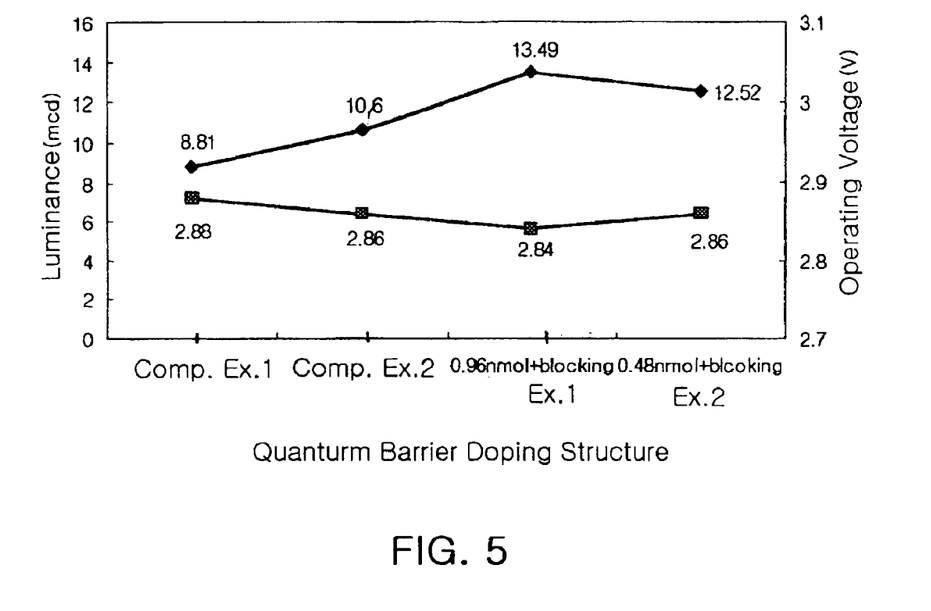
FIG. 5 is a graph depicting results of comparison between semiconductor LEDs according to the present invention and conventional semiconductor LEDs in terms of operating voltage and luminance characteristics.

As shown in FIG. 5, the operating voltages of the LEDs according to Examples 1 and 2 correspond to 2.84V and 2.86V, respectively, which are substantially similar to those of the LEDs according to Comparative Examples 1 and 2, that is, 2.88V and 2.86V, while being within a tolerance range. In terms of luminance characteristics determining the LED power level, the LEDs according to Examples 1 and 2 exhibit luminance values of 13.49 mcd and 12.52 mcd greatly improved over the luminance values of the LEDs according to Comparative Examples 1 and 2, that is, 8.81 mcd and 10.6 mcd, respectively.

Referring to the graph of FIG. 5, it can be seen that the LED of the present invention exhibits a great improvement in luminance characteristics because an n type impurity is doped in quantum barrier layers to achieve a reduction in forward voltage, thereby lowering the operating voltage of the LED while reducing an adverse affect on quantum well layers caused by an n type impurity diffusion.

Although the embodiments of the invention and the annexed drawings have been disclosed only in conjunction with semiconductor LEDs, the present invention is not limited thereto. In other nitride semiconductor devices such as semiconductor laser devices employing an active layer having an MQW structure, an n type impurity may be doped in quantum barrier layers in order to achieve an improvement in forward voltage characteristics. Also, these nitride semiconductor devices may use lightly-doped or intentionally-not-doped anti-diffusion films in order to prevent a degradation in the characteristics of quantum well layers caused by the doped impurity. Accordingly, nitride semiconductor devices of this type may be included in the present invention.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

As apparent from the above description, in a nitride-based semiconductor device having an MQW structure, an n type impurity is doped in quantum barrier layers to reduce the serial resistance caused by those quantum barrier layers, in accordance with the present invention. Anti-diffusion films are also formed at respective interfaces of each quantum barrier layer with the quantum well layers arranged adjacent thereto, in order to prevent n type impurity diffusion into the quantum well layers, in accordance with the present invention. Accordingly, it is possible to achieve an improvement in forward voltage characteristics by virtue of the doped n type impurity while preventing a degradation in the optical characteristics of the quantum well layers caused by an undesirable impurity diffusion. Thus, the present invention can provide a nitride-based semiconductor device, such as a semiconductor LED, exhibiting a superior optical power and a superior optical efficiency.

What is claimed is:

1. A nitride-based semiconductor device comprising:
   a first nitride semiconductor layer doped with an n type impurity;
   an active layer formed on the first nitride semiconductor layer, the active layer including a plurality of quantum well layers and a plurality of quantum barrier layers alternately laminated over one another, at least one of the quantum layers being doped with the n type impurity; and
   a nitride semiconductor layer formed over the active layer, and doped with a p type impurity,
   wherein the at least one quantum barrier layer doped with the n type impurity includes an internal layer portion doped with the n type impurity, and an anti-diffusion film arranged at an interface of the quantum barrier layer with an adjacent one of the quantum well layers, the anti-diffusion film having an n type impurity concentration lower than that of the internal layer portion.

2. The nitride-based semiconductor device according to claim 1, wherein each of the quantum barrier layers is made of $Al_{x1}In_{y1}Ga_{1-x1-y1}N$ ($x_1+y_1=1$, $0\leq x_1 \leq 1$, $0\leq y_1 \leq 1$), and each of the quantum well layers is made of $Al_{x2}In_{y2}Ga_{1-x2-y2}N$ ($x_2+y_2=1$, $0\leq x_2 \leq 1$, $0\leq y_2 \leq 1$) having an energy band gap smaller than that of the quantum barrier layers.

3. The nitride-based semiconductor device according to claim 1, wherein the n type impurity is at least one material selected from a group consisting of Si, Ge, and Sn.

4. The nitride-based semiconductor device according to claim 1, wherein the n type impurity concentration of the anti-diffusion film is 50% or less of the n type impurity concentration of the doped internal layer portion in the associated quantum barrier layer.

5. The nitride-based semiconductor device according to claim 1, wherein the n type impurity concentration of the internal layer portion in the at least one quantum barrier layer doped with the n type impurity is about $3\times 10^{16}/cm^3$ to about $3\times 10^9/cm^3$.

6. The nitride-based semiconductor device according to claim 1, wherein the anti-diffusion film in the at least one quantum barrier layer is not doped intentionally with n type impurity.

7. The nitride-based semiconductor device according to claim 1, wherein the at least one quantum barrier layer doped with the n type impurity comprises one or both of the quantum barrier layers respectively contacting the first and second nitride semiconductor layers while having anti-diffusion films arranged at respective interfaces of the quantum barrier layers with the first and second nitride semiconductor layers.

8. The nitride-based semiconductor device according to claim 1, wherein the at least one quantum barrier layer doped with the n type impurity comprises at least one of the quantum barrier layers each interposed between adjacent ones of the quantum well layers while having anti-diffusion films arranged at respective interfaces of the quantum barrier layer with the adjacent quantum well layers.

9. The nitride-based semiconductor device according to claim 1, wherein the anti-diffusion film of the at least one quantum barrier layer doped with the n type impurity has a thickness corresponding to about 10% to about 40% of the thickness of the quantum barrier layer.

10. The nitride-based semiconductor device according to claim 9, wherein:
   the thickness of the at least one quantum barrier layer doped with the n type impurity is about 3 nm to about 30 nm; and
   the thickness of the anti-diffusion film is about 0.3 nm to about 10 nm.

11. The nitride-based semiconductor device according to claim 1, wherein:
   the at least one quantum barrier layer doped with the n type impurity comprises two or more of the quantum barrier layers included in the active layer; and
   at least one of the two or more quantum barrier layers has an n type impurity concentration different from those of the other quantum barrier layers.

12. The nitride-based semiconductor device according to claim 11, wherein the two or more quantum barrier layers have different n type impurity concentrations, respectively, such that the quantum barrier layer contacting the first nitride semiconductor layer has a highest n type impurity concentration, and the remaining quantum barrier layers exhibit a lower n type impurity concentration at a more adjacent one thereof to the second nitride semiconductor layer.

13. The nitride-based semiconductor device according to claim 11, wherein the anti-diffusion films of the two or more quantum barrier layers have n type impurity concentrations proportional to the concentrations and/or thicknesses of the two or more quantum barrier layers, respectively.

14. The nitride-based semiconductor device according to claim 11, wherein the anti-diffusion films of the two or more quantum barrier layers have thicknesses proportional to the concentrations and/or thicknesses of the two or more quantum barrier layers, respectively.

* * * * *